United States Patent [19]
Wang et al.

[11] Patent Number: 5,677,001
[45] Date of Patent: Oct. 14, 1997

[54] STRIATION-FREE COATING METHOD FOR HIGH VISCOSITY RESIST COATING

[75] Inventors: Li-Ming Wang, Pingtung; Gwo-Yuh Shiau, Hsinchu, both of Taiwan

[73] Assignee: Vanguard International Semiconductor Corporation, Hsin-Chu, Taiwan

[21] Appl. No.: 703,920

[22] Filed: Aug. 22, 1996

[51] Int. Cl.$^6$ .................................................. B05D 3/12
[52] U.S. Cl. ........................... 427/240; 427/299; 427/384; 427/385.5; 437/231
[58] Field of Search .......................... 427/240, 385.5, 427/299, 384; 437/231

[56] References Cited

U.S. PATENT DOCUMENTS

| | | | |
|---|---|---|---|
| 5,066,616 | 11/1991 | Gordon | 427/240 |
| 5,405,813 | 4/1995 | Rodrigues | 427/240 |
| 5,498,449 | 3/1996 | Bae | 427/240 |

OTHER PUBLICATIONS

S. Wolf. "Silican Processing In the VLSI Era", vol. 1, Lattice Press, Sunset Beach CA, p. 433 no date.

*Primary Examiner*—Janyce Bell
*Attorney, Agent, or Firm*—George O. Saile

[57] ABSTRACT

A method is proposed where striation-free coating of photoresist on a wafer is possible. This is accomplished by first prewetting the wafer with a particular agent, or solution, at a particular rate while the wafer is being accelerated to a predetermined rotational speed. Then the prewetting solution is cut off, after which the wafer is accelerated to a second rotational speed. Next, a photoresist of relatively high viscosity is dispensed concurrently with the wafer being accelerated to a third rotational speed, In order to achieve much reduced thickness variations than found in prior art, the third speed and the dispense rate are set at an unexpectedly lower value than that would be expected with a high viscosity photoresist. It is shown that with the disclosed method, critical dimensions of linewidths are preserved and product yield is improved.

23 Claims, 3 Drawing Sheets

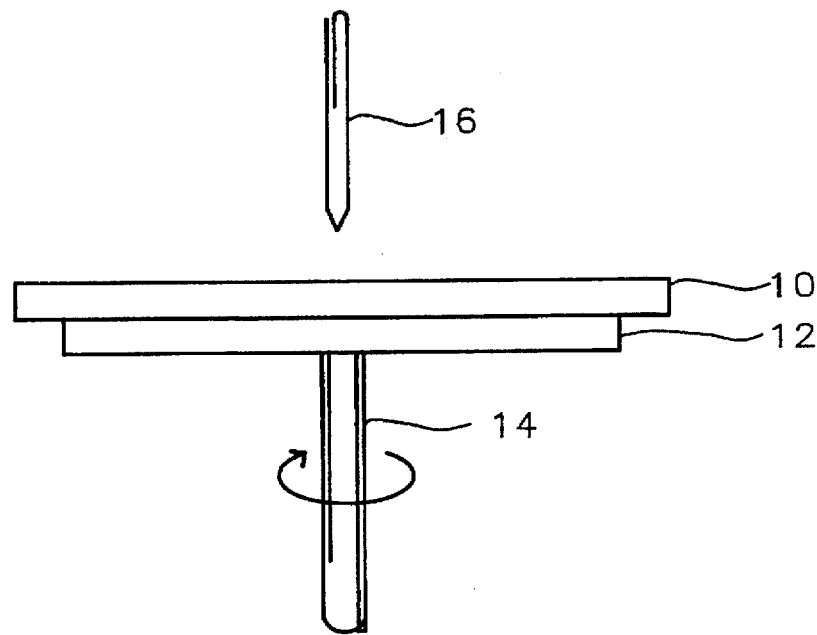
FIG. 1 – *Prior Art*
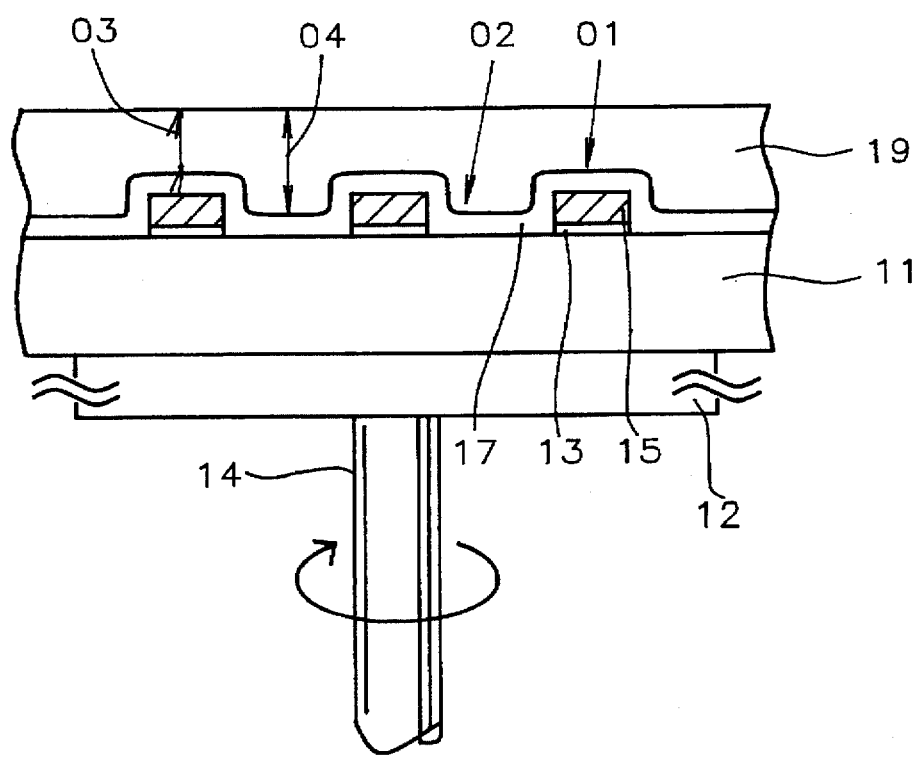
FIG. 2 – *Prior Art*

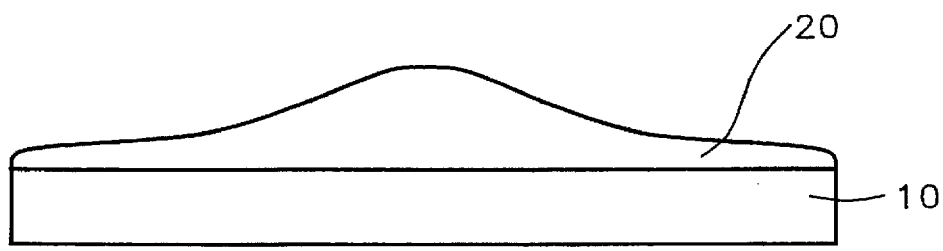
*FIG. 3a — Prior Art*
*FIG. 3b — Prior Art*
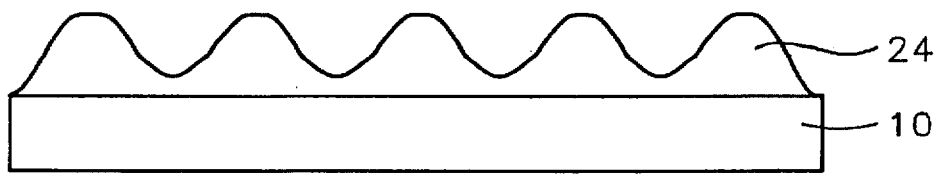
*FIG. 3c*

STRIATION-FREE COATING METHOD FOR HIGH VISCOSITY RESIST COATING

BACKGROUND OF THE INVENTION

(1) Field of the Invention

The invention relates generally to a method of applying coating materials to surfaces, and in particular, applying photoresist to wafers in the manufacture of semiconductor devices.

(2) Description of the Related Art

Semiconductor devices are formed by well-known techniques into silicon substrates in regions which are precisely defined. Similarly, other regions on the silicon substrate that contain metal lines that connect the so formed device regions to form VLSI (very large scale integrated) circuits are also precisely defined. The patterns that define such regions are created by lithographic processes. A most common process involves first spin-coating photoresist materials onto the wafer surface. Next, the resist layer is selectively exposed to a form of radiation, such as ultraviolet light, electrons, or x-rays. An exposure tool and mask are used to affect the desired selective exposure. The patterns in the resist are formed when the exposed areas are developed, that is, depending upon the resist used, either dissolved, or fixed in place. In either case, the areas that are now open are subjected to any one of the well-known techniques to form the patterns therein. It is the nature of the photoresist, and more importantly, the thickness of the photoresist material that determines the preciseness of the dimensions of patterns so formed. The exactitude by which each pattern is formed through exposure to radiation energy depends upon the volume of resist material that is exposed to that energy. Hence for the same radiation energy and same pattern, the lateral dimensions of the pattern will vary depending upon the thickness of resist that is present under the radiated area. Such variations in dimensions are usually cause for defective parts, as is well known in the field. It is, therefore, of paramount importance to control the thickness of the coating, especially with the sub-micron lithographic technology of today.

Spin coating of wafers is accomplished by dispensing a coating material onto a spinning wafer. As shown in FIG. 1, usually, wafer (10) is mounted on vacuum chuck (12) having a diameter slightly less than that of said wafer. The disk shaped chuck has holes in it which are connected to a vacuum pipe (not shown), and thus is capable of holding the wafer on its surface when vacuum is applied through the holes. The vacuum chuck is in turn fixed onto a spindle (14) that is rotated by means of a motor (not shown). Commonly, the chuck and the wafer are oriented horizontally and facing upward as shown in FIG. 1.

In practice, the inactive or bottom side of the wafer is held against the surface of the rotating chuck while a desired amount of liquid photoresist is applied through a dispenser (16) at the center of the top surface of the wafer. Being under the influence of centrifugal forces, the photoresist material then spreads outwards from the center to the edges of the wafer, thus coating the entire surface. Excess photoresist is sloughed off of the wafer during the rotation process. The speed of rotation of the wafer, the amount and the properties of the coating material are adjusted in different ways for different applications to achieve a desired uniform thickness.

Variations in thickness of the coating material do occur, however, and in different ways. The causes for the variations may be ascribed to three effects; the topography of the surface on to which the material is being spun, the fluid dynamics of the flow, and the properties of the material that is being spun.

The topography of a layer of material introduced onto the surface of a wafer is determined by the features that are already present on the surface of the wafer. Thus, in FIG. 2, there is shown wafer (10) of FIG. 1, but a much larger cross-section thereof. In said cross-section, metal lines (15) have been formed on insulation layers (13) deposited on silicon substrate (11). A conformal, interlevel dielectric layer (17) is also provided as shown in FIG. 2. It will be observed in the same Figure that corresponding to places where metal lines are present and not present, there are, "hills" (01) and "valleys" (02) thereover. Consequently, when a coating material such as photoresist is spin coated on a topography consisting of said hills and valleys, the thickness of photoresist (19) will vary accordingly as shown in FIG. 2. Thus, thickness (03) over a hill is smaller than thickness (04) over a valley. As stated in U.S. Pat. No. 5,498,449, when photoresist (19) is radiated for the purpose of forming patterns thereon, the energy absorbed by the photoresist layer is not uniform by its portions because of its different thickness. Therefore, the finished photoresist patterns are different in size from one another, leading to a decrease in the uniformity of critical dimension. Accordingly, since the final patterns are not similar to one another, the production yield and the reliability of a semiconductor device are lowered. To solve this problem, it is proposed in the same U.S. Pat. No. 5,498,449 to turn wafer upside down (not shown here), wafer (10), spindle (14) and all, and spin it at a high speed so that with the aid of gravity acting downward, force photoresist (19) to follow the hills and valleys of the underlying topography, thereby making the thickness of the photoresist layer almost the same at all positions, that is, the same over both the hills and the valleys.

The dynamics of the flow of a spinning fluid will also cause variations in the thickness of said fluid irrespective of the topography of the wafer. For example, the thickness of a coating layer may be much greater at the center of the wafer than at the edge, thus forming a bump (20) in the middle as shown in FIG. 3a. Or, the distribution of the coating material across the surface may be such as to form a "dish shaped" (22) configuration with higher layer thickness at the edges than at the center of the wafer (FIG. 3b). Studies have shown that, such behavior of a photoresist material (of constant molecular weight, solution concentration, etc.,) depends only on the spinning parameters. Various mathematical relationships have been developed to predict resist thickness as it depends upon such factors as percent solids, spin speed, etc. Prior art, however, is replete with empirical data for specific process applications. Some of the data include specific parameters such as resist formulation, spinner type, wafer size, spin parameters, and so on. A study of thickness variation across a wafer as a function of many such parameters, including volume of resist dispense, wafer diameter, resist viscosity, wafer spin-speed during dispense, wafer acceleration and final spin-speed is reported in S. Wolf, "Silicon Processing for the VLSI Era," vol. 1, Lattice Press, Sunset Beach, Calif., 1990, p. 433.

In U.S. Pat. No. 5,405,813, the dynamics of resist flow is manipulated by means of changing the rotational speed of the wafer at specific times. At the same time, the amount of resist being dispensed is varied. In this manner, photoresist of uniform thickness is formed over the surface of the wafer while simultaneously reducing the amount of photoresist material used in the coating process. Specifically, the wafer is rotated about a central axis such that it reaches a first rotational speed. As it is further stated in said patent, next, the semiconductor wafer is decelerated from the first rotational speed to a second rotational speed while a minimal amount of photoresist material is concurrently dispenses onto the top surface of the semiconductor wafer. As the wafer reaches the second rotational speed, the dispensing of the photoresist material onto the top surface of the semiconductor wafer is stopped. The semiconductor wafer is then accelerated from the second rotational speed to a third rotational speed. Upon reaching the third rotational speed, the semiconductor wafer is maintained at the third rotational speed such that the photoresist material is spread in a uniform layer over the top surface of the semiconductor wafer. Next, the semiconductor wafer is accelerated from the third rotational speed to a fourth rotation speed, and is maintained at the fourth rotational speed such that the uniform layer of the photoresist material on the top surface of the semiconductor wafer is dried.

While said procedures in said U.S. Pat. No. 5,405,813 teach how to reduce thickness variations caused by "dishing" out towards the edges of a wafer, or "bumping" towards the center, prior art is in want of controlling still another type of variation caused by the furrowing of the resist in the radial direction as it is being spun out under the influence of centrifugal forces. The furrowing, which is superimposed on the underlying photoresist layer, results in a wavy thickness variation as shown in FIG. 3c. The wavy furrowing are streaks of thickness different from the nominal resist thickness and sometimes are referred to as striation. Usually, the degree of striation increases with topographical step height and resist viscosity. A method is proposed in the present invention whereby thickness variations of the types shown in FIGS. 3a–3c are reduced substantially. This is accomplished by prewetting the wafer with photoresist, but of a different physical property, namely, viscosity, from the viscosity of the final photoresist that spun onto the wafer at specific rotational speeds. It will be evident later that the preferred embodiments are the result of some unexpected behavior of photoresist having relatively high viscosity.

SUMMARY OF THE INVENTION

It is therefore an object of this invention to provide a method for striation-free coating of high viscosity photoresist onto a topographical step-height semiconductor wafer.

It is another object of this invention to provide a method for reducing thickness variations caused by wafer topography in the coating of photoresist.

It is still another object of this invention to provide a method for reducing the amount of photoresist used in coating a semiconductor wafer.

These objects are achieved according to the present invention by first continuously prewetting the wafer while spinning it to a predetermined rotation speed. After the dispensing of the prewetting agent has been stopped, the wafer is accelerated to a second rotation speed. Next, photoresist of high viscosity is dispensed while the wafer is accelerated to a third rotation speed. In order to achieve much reduced thickness variations, the third speed and the dispense rate are set at an unexpectedly lower value than that would be expected with a high viscosity photoresist. The reduced amount of photoresist is achieved by reducing the dispense rate of the photoresist without introducing any detrimental effects on the coated layer.

BRIEF DESCRIPTION OF THE DRAWINGS

The objects and features of this invention will become apparent more readily from a reading of the detailed description in conjunction with the drawings that follow:

FIG. 1 is a sectional view showing a wafer mounted on a prior art vacuum chuck and positioned under a centrally located photoresist dispenser.

FIG. 2 is a sectional view showing a prior art technique for spin coating photo resist.

FIGS. 3a, 3b and 3c are cross sectional views of semiconductor wafers having conventionally non-uniform photoresist layers formed thereon.

FIG. 4b is a schematic showing conventional variation of photoresist thickness along a cross-section of one of the radials of FIG. 4a.

DESCRIPTION OF THE PREFERRED EMBODIMENTS

Figure 4A:
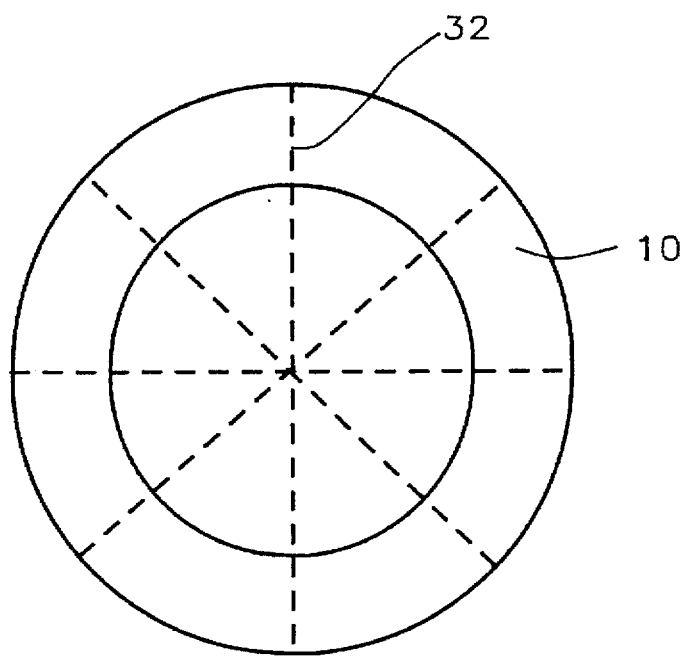
FIG. 4a is a plan view of a wafer showing radial lines emanating from the center of the wafer according to this invention.

Referring now to the drawings, and once again to Prior Art FIGS. 3a, 3b and 3c, there are shown cross-sections of semiconductor wafers having non-uniform, that is, variable photoresist layers. With reference to FIG. 3b, a "dish-shaped" layer of photoresist 20 is thicker at the edges of semiconductor wafer (10) than at the center of wafer (10). In FIG. 3a, the layer of photoresist (22) spun onto wafer (10) is thicker at the center of wafer (10) than at the edges of said wafer. Still another variation in the photoresist layer thickness is of wavy (24) nature as shown in FIG. 3c caused by radial resist striations. In all of the aforementioned cases, variations in the thickness of photoresist layer will adversely affect subsequent processing steps to which said wafer will be subjected. Consequently, critical dimensions such as that of linewidths in a metal layer will vary on the same wafer due to the variations in the thickness of the photoresist layer.

In arriving at the preferred embodiments of the present invention, several experiments were conducted to substantially reduce the radial striations (that is, radial streaks of thickness different from the nominal resist thickness across the wafer) as depicted in FIG. 3c. First, it was observed that when photoresist of conventional properties, such as that of MCPRi 7010N, manufactured by Mitsubishi was spun on wafer (10) of FIG. 4a, the thickness variation along a cross-section of one of radials (32) was between about 1900 angstroms (Å) to 2000 Å. It is preferred that the thickness variation does not exceed between about 50 Å to 100 Å. Thus, experiments were conducted varying viscosity, dispense rate of the photoresist and the rotational speed of the wafer when photoresist is dispensed. It was found that with conventional viscosity ranges between about 4 centipoise (cp) to 16 cp, the striation could hardly be found. However, the striation was observed when higher viscosity resists were used. Our experiments with higher viscosity resists in the range between about 35 cp to 50 cp did show substantial improvement as indicated in Table I below:

TABLE I

| Viscosity | Rotation speed | Dispense Rate | Striation |
|---|---|---|---|
| 35 cp–50 cp | 2000–4000 rpm | 0.85–1.0 cc/sec | 1900–2000 Å |
| 35 cp–50 cp | 1500–3000 rpm | 0.6–0.9 cc/sec | 50 to 100 Å. |

Figure 4B:
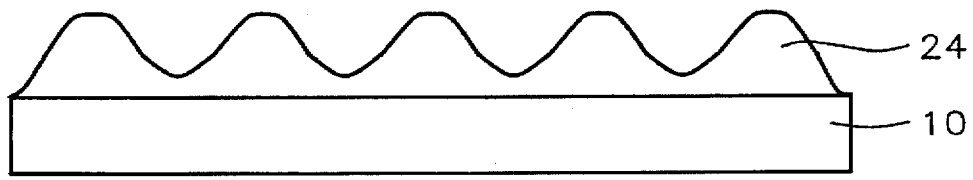
Figure 4C:
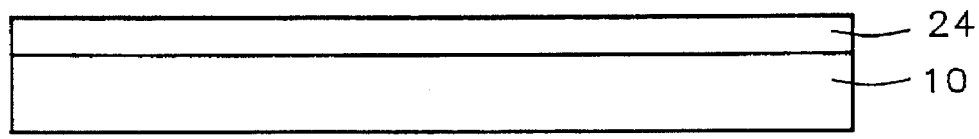
FIG. 4c is a schematic showing reduced variation of photoresist thickness along a cross-section of one of the radials of FIG. 4a, according to this invention.

The data from the first row of conditions in Table I correspond pictorially to the schematic shown in FIG. 4b, while that of the improved conditions depicted in FIG. 4c correspond to data in the second row of said Table. It is also of interest to observe from the Table above that, unexpectedly, the higher viscosity photoresist requires lower rotational speed to achieve reduced striated thickness variation.

In the present invention, therefore, the results of the experiments cited above are formulated into a preferred embodiment as described below. However, in the description, numerous details are set forth, such as specific materials, process parameter, etc., in order to provide a thorough understanding of the present invention. It will be obvious to those skilled in the art that these specific details need not be employed to practice the present invention.

Thus, the bottom surface of a semiconductor wafer is placed onto a vacuum chuck for applying photoresist to the top surface of the wafer. The wafer is oriented in a horizontal plane with the top surface of the wafer facing upwards. Next, the wafer is wetted with a prewetting agent AZEBR of viscosity 1 cp to 5 cp while being spun from 0 to 200 rpm in about 0 to 3 seconds and dispensed in the amount between about 2 to 5 cubic centimeters (cc). Although such a speed and dispense rate are used in the present embodiment, the present invention is also well suited to variations in these parameters.

After the wafer has reached the first rotational speed of 200 rpm, and the prewetting agent been dispensed, the wafer is maintained at said speed between about 1 to 2 seconds just long enough for the wafer to stabilize at the first rotational speed. Then the wafer is accelerated to a second rotational speed between about 500 to 2000 rpm and stabilized at that speed between about 2 to 5 seconds.

As a main feature and key spirit of the present invention, the next step is the dispensing of a relatively high viscosity photoresist. In the preferred embodiment, the photoresist is of type MCPRi 7010N with viscosity in a range between about 35 cp to 50 cp. In the present invention, the photoresist is dispensed at a constant rate in the range between about 0.6 to 1.0 cc/sec for a duration between about 4 to 8 sec. Said photoresist is dispensed throughout the entire acceleration from the second rotation speed to third rotational speed between about 1500 to 3000 rpm. After the photoresist is dispensed, the wafer speed is then accelerated to the fourth speed between about 2000 to 3800 rpm and stabilized at that speed between about 20 to 30 seconds to obtain the required photoresist thickness.

Accordingly, it will be appreciated by those skilled in the art that with said dispense rates as low as 0.6 cc/sec, there is the additional benefit of substantially reduced amount of photoresist material needed to coat a wafer. A further benefit of the present invention is the experimentally observed repeatability of the reduced thickness variations between wafers. That is, using the method described above, the variance in mean thickness between separate semiconductor wafers is reduced. In typical prior art photoresist coating methods, the variance between the mean thickness of the layer of photoresist on separate wafers coated at the same time, will be as high as several hundred angstroms (See U.S. Pat. No. 5,405,813). However, the results of experiments of this invention a range typically between about 50 to 100 Å.

Thus, the method of present invention provides for the formation of a photoresist layer free of striation effects onto the top surface of a topographical step-height semiconductor wafer and which does so by using a decreased amount of photoresist material. Additionally, the present method provides increased repeatability between the mean thickness of the photoresist layer on different wafers processed at different times. The claimed improvements contribute to the overall improvements in the manufacture of semiconductor products.

While the invention has been particularly shown and described with reference to the preferred embodiments thereof, it will be understood by those skilled in the art that various changes in form and details may be made without departing from the spirit and scope of the invention.

What is claimed is:

1. A method for photoresist coating of semiconductor wafer comprising the steps of:
   providing a chuck;
   providing a spindle for said chuck;
   providing a photoresist dispenser;
   mounting said wafer on said chuck;
   spinning said vacuum chuck on said spindle to a first rotational speed;
   dispensing prewetting agent on said wafer on said chuck;
   stabilizing said first rotational speed by maintaining it at said first rotational speed;
   accelerating said wafer to a second rotational speed;
   stabilizing said second rotational speed by maintaining it at said second rotational speed;
   accelerating said wafer to a third rotational speed;
   dispensing photoresist onto said prewetting agent on said wafer;
   accelerating said wafer to a fourth rotational speed; and
   stabilizing said fourth rotational speed by maintaining it at said fourth rotational speed.

2. The method of claim 1, wherein said chuck has a plurality of vacuum holes.

3. The method of claim 2, wherein said holes are connected to a vacuum pump.

4. The method of claim 1, wherein said chuck is mounted on said spindle.

5. The method of claim 1, wherein said wafer is mounted on said chuck having a diameter slightly less than that of the wafer.

6. The method of claim 1, wherein said spindle is rotated by means of a motor.

7. The method of claim 1, wherein said first rotational speed is between about 0 revolutions per minute (rpm) to 200 rpm.

8. The method of claim 1, wherein said dispenser is located centrally with respect to the surface of said wafer on said chuck.

9. The method of claim 1, wherein said prewetting agent is a chemical solution made thinner with a viscosity of between about 1 cp to 5 cp.

10. The method of claim 9, wherein said prewetting agent is dispensed at a rate between about 2 to 5 cubic centimeters per second.

11. The method of claim 10, wherein said prewetting agent is dispensed for a duration between about 1 to 3 sec.

12. The method of claim 1, wherein said first rotational speed is maintained for a duration between about 1 to 2 seconds.

13. The method of claim 1, wherein said second rotational speed is between about 500 to 2000 rpm.

14. The method of claim 1, wherein said second rotational speed is maintained for a duration of 2 to 5 seconds.

15. The method of claim 1, wherein said third rotational speed is between about 1500 rpm to 3000 rpm.

16. The method of claim 1, wherein the viscosity of said photoresist is between about 35 cp to 50 cp.

17. The method of claim 16, wherein said photoresist is dispensed at a rate of between about 0.6 cc to 1.0 cc/sec.

18. The method of claim 16, wherein said photoresist is dispensed for a duration of between about 4 to 8 seconds.

19. The method of claim 1, wherein said fourth rotational speed is between about 2000 to 3800 rpm.

20. The method of claim 1, wherein said fourth rotational speed is maintained for a duration of between about 20 to 30 seconds.

21. A process for forming striation-free coating of high viscosity photoresist on a topographical semiconductor wafer comprising the steps of:

mounting the bottom surface of said wafer onto a vacuum chuck of a photoresist coating system such that the wafer is oriented horizontally and facing upward;

rotating said vacuum chuck about a central axis such that said wafer attains a first rotational speed in the range between about 0 to 200 rpm;

concurrently with accelerating to said first rotational speed, dispensing a prewetting agent at a constant rate between about 2 to 5 cubic centimeters (cc) per second, for a duration of between about 1 to 3 seconds;

ceasing said dispensing of prewetting agent, and stabilizing said first rotational speed for a duration of between about 1 to 2 seconds;

accelerating said wafer to attain a second rotational speed between about 500 to 2000 rpm, and maintaining said second rotational speed for a duration of between about 2 to 5 seconds;

accelerating said wafer to attain a third rotational speed between about 1500 rpm to 3000 rpm while concurrently dispensing photoresist at a rate between about 0.6 to 1 cc/sec, and for a duration between about 4 to 8 seconds; and accelerating said wafer to attain a fourth rotational speed between about 2000 to 3800 rpm, and maintaining said fourth rotational speed for a duration of between about 20 to 30 seconds.

22. The method of claim 21, wherein said prewetting agent has a viscosity between about 1 cp to 5 cp.

23. The method of claim 21, wherein said photoresist coating has a viscosity between about 35 cp to 50 cp.

* * * * *